United States Patent
Sakata et al.

[11] Patent Number: 6,123,552
[45] Date of Patent: Sep. 26, 2000

[54] IC SOCKET

[75] Inventors: Masato Sakata, Utsunomiya; Satoru Zama, Nikko; Hitoshi Yuzawa, Imaichi; Kazuto Ono, Nikko, all of Japan

[73] Assignee: Furukawa Electric Co., Ltd., Tokyo, Japan

[21] Appl. No.: 09/155,304
[22] PCT Filed: Jan. 28, 1998
[86] PCT No.: PCT/JP98/00349
§ 371 Date: Sep. 23, 1998
§ 102(e) Date: Sep. 23, 1998
[87] PCT Pub. No.: WO98/33248
PCT Pub. Date: Jul. 30, 1998

[30] Foreign Application Priority Data

Jan. 29, 1997 [JP] Japan ................................. 9-029597

[51] Int. Cl.[7] ............................................. H01R 12/00
[52] U.S. Cl. ........................................... 439/71; 439/331
[58] Field of Search ............................. 439/70, 71, 73, 439/86, 81, 85, 331, 66

[56] References Cited

U.S. PATENT DOCUMENTS

| 4,593,463 | 6/1986 | Kamono et al. | 439/71 |
| 4,806,104 | 2/1989 | Cabourne | 439/66 |
| 4,871,316 | 10/1989 | Herrell et al. | 439/66 |
| 5,061,192 | 10/1991 | Chapin et al. | 439/66 |
| 5,247,250 | 9/1993 | Rios | 439/70 |
| 5,342,206 | 8/1994 | Grabbe et al. | 439/71 |
| 5,902,144 | 5/1999 | Hay | 439/331 |

FOREIGN PATENT DOCUMENTS

| 0 428 359 A1 | 5/1991 | European Pat. Off. . |
| 63-61788 | 4/1988 | Japan . |
| 63-288048 | 11/1988 | Japan . |
| 6-223936 | 8/1994 | Japan . |
| 8-203641 | 8/1996 | Japan . |
| 9-161926 | 6/1997 | Japan . |
| 9-320720 | 12/1997 | Japan . |

Primary Examiner—Renee Luebke
Assistant Examiner—T. C. Patel
Attorney, Agent, or Firm—Frishauf, Holtz, Goodman, Langer & Chick, P.C.

[57] ABSTRACT

There is provided an IC socket having a plurality of contact pins 1. The plural contact pins 1 are arranged in a matrix form so that the pitch thereof at one end agrees with the electrode pitch of a semiconductor device 13 to be mounted and the pitch at the other end agrees with the pitch of the electrical connection terminals of an external connection body to be connected.

8 Claims, 11 Drawing Sheets

IC SOCKET

TECHNICAL FIELD

The present invention relates to an IC socket used for inspecting the electrical properties of a semiconductor device such as a LSI and a bare chip.

BACKGROUND ART

With advances in densification of semiconductor devices, the demand is rapidly increasing for IC packages such as a ball grid array (BGA) or pin grid array (PGA), in which connecting solder balls are arranged in an array form or in a matrix form as electrodes, or a land grid array (LGA), in which solder balls are not mounted.

For these IC packages, the pitch between the electrodes tends to decrease from 1.0 mm to 0.8 mm to 0.5 mm with the densification of semiconductor devices.

Generally, the semiconductor devices are subject to a burn-in test after being manufactured. In the burn-in test, a semiconductor device is mounted on an IC socket and heated under predetermined conditions to check the electrical properties thereof.

Conventionally, for the IC socket, contact pins in contact with the electrodes of semiconductor device are embedded in a synthetic resin so that the pitch thereof is equal to that of the electrodes of semiconductor device. One end of the contact pin comes into contact with the electrode of semiconductor device, and a leg extending to the outside of socket at the other end is inserted into and connected to a printed board, and further connected to an external tester or the like.

This printed board not only is a wiring board but also has a function of enlarging and changing the minute pitch of contact pins, which has been set so as to be equal to the pitch between electrodes of semiconductor device, to a pitch between connecting terminals for the external tester or the like. For example, the pitch of contact pins of 1.0 mm is enlarged and changed to 1.27 mm or 2.54 mm, the pitch between connecting terminals for the external tester, or when the electrode arrangement of semiconductor device is of a matrix form, the arrangement of contact pins is enlarged and changed in the matrix form, or the arrangement itself is changed.

As the pitch between electrodes of semiconductor device decreases and a two-dimensional electrode arrangement such as a matrix-form arrangement is used, a multilayer printed board of 4 to 8 layers or 10 layers etc. must be used as a printed board for enlarging and changing the pitch of contact pins in the IC socket.

However, if the printed board is made multilayered, there arises a problem in that the manufacturing cost increases, and therefore the cost required for the burn-in test of the semiconductor device also increases.

The present invention was made in view of the above situation, and accordingly an object thereof is to provide an IC socket capable of inspecting the electrical properties of a semiconductor device at a low cost without using an expensive multilayered printed board.

DISCLOSURE OF THE INVENTION

To achieve the above object, the present invention provides an IC socket having a plurality of contact pins, in which the plural contact pins are arranged in a matrix form so that the pitch thereof at one end agrees with the electrode pitch of a semiconductor device to be mounted and the pitch at the other end agrees with the pitch of the electrical connection terminals of an external connection body to be connected.

Preferably, the plural contact pins are formed by a plurality of lead frames each having a plurality of leads arranged in parallel in a single plane, the pitch of the plural leads of each lead frame on one side agrees with the electrode pitch of the semiconductor device to be mounted and the pitch thereof at the other end agrees with the pitch of the electrical connection terminals of the external connection body to be connected, and one end side and the other end side of the plural leads are bent substantially in parallel via a step portion with respect to the single plane, by which the plural contact pins are formed by stacking said lead frames.

Also preferably, each of the lead frames is formed with a spring portion formed in an arcuate shape on one end side of the plural leads, and is provided with a first fixing portion for fixing the plural leads in the vicinity of the spring portion in the arrangement direction with an electrical insulating synthetic resin.

Further preferably, each of the lead frames is provided with a second fixing portion for fixing the other end side of the plural leads in the arrangement direction with an electrical insulating synthetic resin.

Preferably, a perforated plate for positioning each contact pin is provided on one end side of the plural contact pins on which the semiconductor device is mounted.

Also preferably, when the plural lead frames are stacked by the first fixing portion or second fixing portion, the pitches at both ends of leads agree with the electrode pitch of the semiconductor device and the pitch of electrical connection terminals of the external connection body, respectively.

According to the first invention, the IC socket is connected directly to the terminal of external connection body such as an external tester for performing burn-in test. Therefore, the need for using an expensive multilayer printed board for changing the pitch is eliminated. At this time, when the arrangement of plural contact pins of the IC socket on one side thereof, that is, on the semiconductor device side is two-dimensional, the pitch of the plural contact pins on the other side, that is, on the external connection body side is not necessarily needed to be enlarged two-dimensionally, but may be enlarged one-dimensionally.

According to the second invention, when the lead frame is bent, the pitch in the direction perpendicular to the lead arrangement direction can be set at the lead frame stacking intervals at the other end, that is, on the external connection body side of the lead by appropriately changing the height of a step portion. At this time, the pitch in the lead arrangement direction can be determined arbitrarily when the lead frame is prepared.

Therefore, for the IC socket of the second invention, the pitch of the plural contact pins is enlarged and changed from the electrode pitch of the semiconductor device to the pitch of the electrical connection terminal of the external connection body, so that an inexpensive printed board such as a double side laminated plate and four layer laminated plate can be used.

According to the third invention, the plural contact pins in each lead frame are fixed in the vicinity of the spring portion with a synthetic resin, so that each contact pin applies a fixed spring pressure to the electrode of semiconductor device regardless of the arrangement position.

According to the fourth invention, the plural contact pins in each lead frame are fixed on the other end side, that is, on the external connection body side with a synthetic resin, so that the pitch of the plural contact pins is kept constant on the external connection body side.

According to the fifth invention, the pitch of the plural contact pins is kept constant on the semiconductor device side by the perforated plate.

According to the sixth invention, the electrode pitch of the semiconductor device and the pitch of the electrical connection terminal of the external connection body are determined when the lead frame is prepared, so that the IC socket is easy to assemble.

BEST MODE OF CARRYING OUT THE INVENTION

One embodiment of the present invention will now be described in detail with reference to FIGS. 1 to 14.

Figure 2:
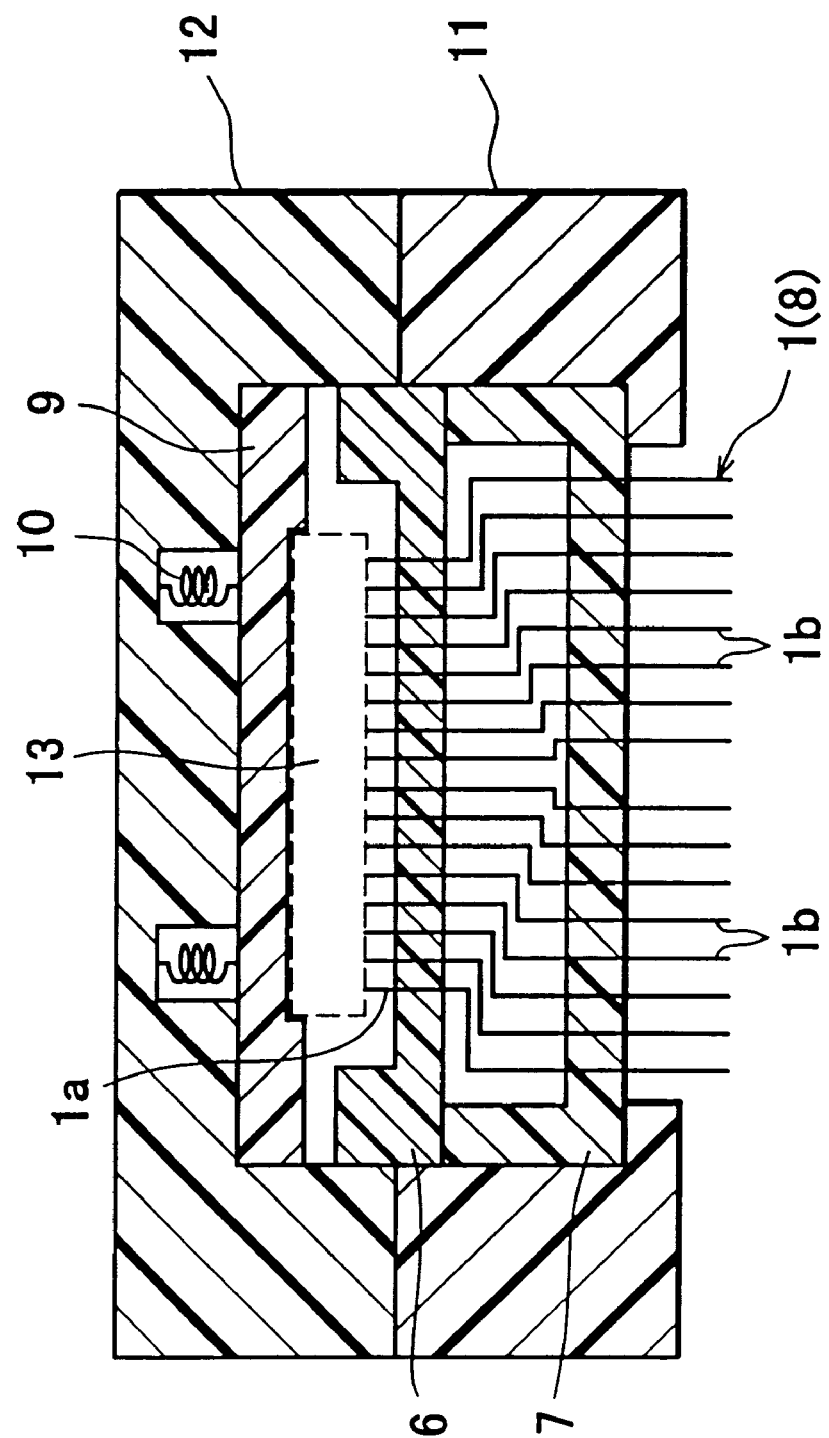
FIG. 2 is a sectional view showing a state in which the IC socket is incorporated in a case to measure the electrical properties of an IC package.

For an IC socket in accordance with a first embodiment, as shown in FIG. 2, an IC package 13 is mounted on the side of one end 1a of a lead (contact pin) 1, and an external connection body is connected to the side of the other end 1b. Here, the IC package 13 has electrodes arranged in a matrix form, the longitudinal and transverse pitches between electrodes being 0.5 mm, and the number of electrodes being 16×16, a total of 256. For the external connection body, the pitch between connection terminals is 1.27 mm, and the number of connection terminals is 16×16, a total of 256.

The mode of carrying out the present invention will be described in detail with reference to the drawings.

Figure 1A:
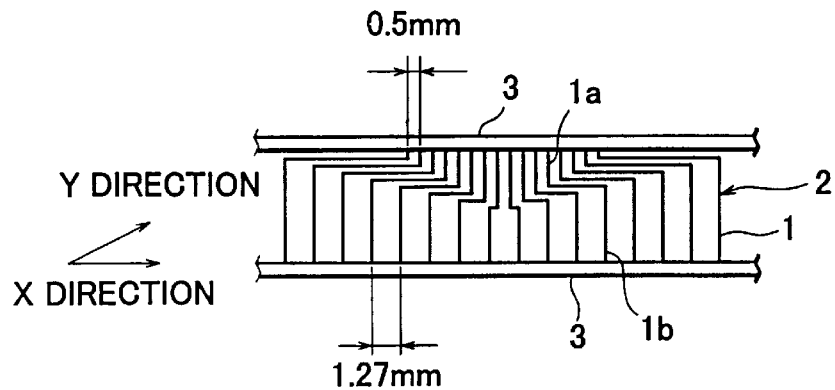
FIGS. 1A to 1C are views showing a process for manufacturing a socket body of an IC socket, for explaining a first embodiment of an IC socket in accordance with the present invention.
Figure 1B:
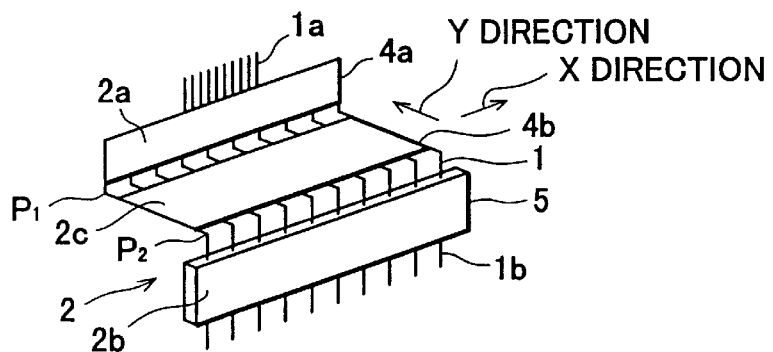
Figure 1C:
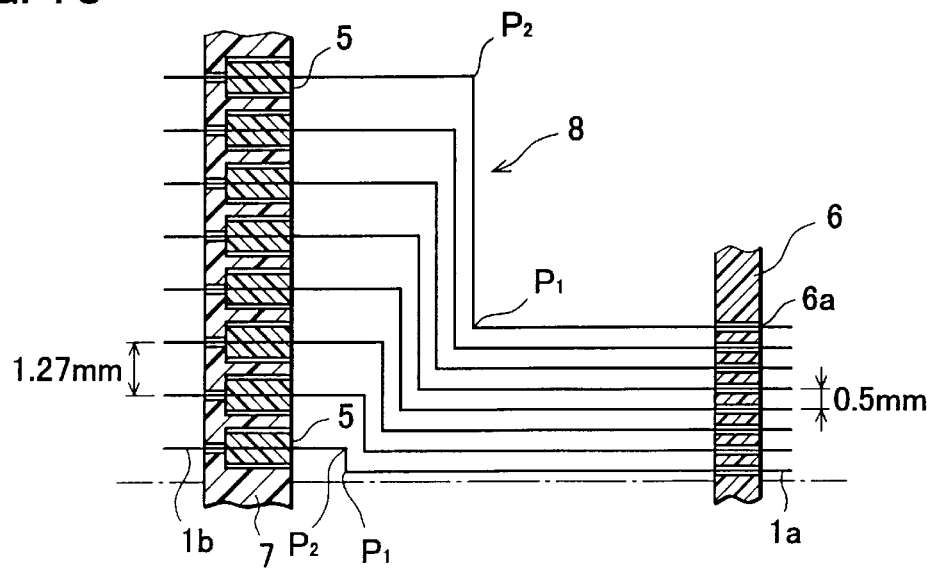

FIGS. 1A to 1C are views showing a process for manufacturing a socket body used for the IC socket of this embodiment. The following is a description of the process.

1) Sixteen lead frames 2 each having 16 leads 1 arranged in parallel in a single plane were manufactured by etching using a beryllium copper alloy sheet with a thickness of 0.1 mm (FIG. 1A). As an etchant, for example, ferric chloride solution or the like was used. Both ends 1a and 1b of 16 leads 1 are each connected to the adjacent lead 1 via a frame 3, whereby the lead frame 2 is formed.

The arrangement direction of the leads 1 in the lead frame 2 is taken as the X direction, and the direction perpendicular to the plane of the lead frame 2 as the Y direction. The pitch (X direction) at one end 1a (0.1 mm wide, in contact with an IC package) of the leads 1 is 0.5 mm, and the pitch (X direction) at the other end 1b (connected to an external connection body) of the leads 1 is enlarged to 1.27 mm.

At both of the ends 1a and 1b of the lead 1, for example, Ni plating with a thickness of about 3 $\mu$m was given to the substrate, and Au plating with a thickness of about 0.3 $\mu$m was given to the part on the substrate to provide a good electrical contact.

Both of the ends 1a and 1b of the leads 1 need not be connected by the frame 3, but at least one end 1a or the other end 1b has only to be connected.

2) Next, as shown in FIG. 1B, two insulating tapes 4a and 4b were affixed in the X direction of the lead frame 2 to fix the leads 1. Subsequently, the lead frame 2 was bent at right angles in the Y direction at a position P1 a predetermined distance apart from the tip end of one end 1a, and then it was bent at right angles in the reverse direction at a position P2 a predetermined distance apart from the position P1, by which a step portion 2c was formed so that the arrangement planes 2a and 2b of the leads 1 were in parallel to each other on both sides of the step portion 2c.

Next, leg portions on the other end 1b side of the leads 1 were mold fixed by an electrical insulating resin 5, and the frame 3 was cut off.

Two sets of 8 lead frames 2 formed in this manner by shifting the bending positions P1 and P2, that is, a total of 16 lead frames 2 were manufactured. The bending positions P1 and P2 were set so that the interval of one end 1a, 1a is 0.5 mm and the interval of the other end 1b, 1b is 1.27 mm when the lead frames 2 were stacked as shown in FIG. 1C.

3) Next, as shown in FIG. 1C, the aforesaid 16 lead frames 2 were stacked at a predetermined intervals to form a socket body 8, by which an IC socket was manufactured. FIG. 1C is a sectional view of one side, that is, eight of 16 lead frames 2 stacked in symmetry, viewed in the X direction.

At this time, plural lead frames 2 were stacked as described below. A thermosetting and electrical insulating resin perforated plate 6 was manufactured which was formed with 16×16=256 holes 6a 0.2 mm in diameter with longitudinal and transverse pitches of 0.5 mm (pitch of connecting pad (electrode) of IC package).

First, the resin 5 was inserted in a fixing frame 7 to position and fix the other end 1b side of the leads 1 to the fixing frame 7.

Next, the perforated plate 6 was disposed on one end side on which the IC package 13 is mounted, one end 1a of the lead 1 was inserted in the hole 6a for positioning, and thereby 16 lead frames 2 were fixed.

The perforated plate 6 is not necessarily needed if one end 1a of the lead 1 can be positioned properly with respect to each connecting pad (electrode) of a semiconductor device such as the IC package 13.

FIG. 2 is a sectional view of the above-mentioned IC socket incorporated in a case having a pressing plate 9, an outside frame body 11, and a cover 12. When the electrical properties of the IC package 13 is inspected by using this IC socket, the IC package 13 is pushed down by the pressing plate 9 pressed down by the urging force of springs 10, by which one end 1a of the lead 1 corresponding to each connecting pad (electrode) is pressed. In FIG. 2, the resin 5 for fixing the leg portions on the other end 1b side of the leads 1 is omitted.

In the above embodiment, if the tip end of one end 1a of the lead 1 is formed sharply, the contact resistance with the connecting pad (electrode) of the IC package 13 becomes low, which is preferable in measuring the electrical properties of the IC package 13. Also, if one end 1a of the lead 1 is curved partially in the X or Y direction, one end 1a has a spring property, so that damage to the connecting pad (electrode) of the IC package 13 is reduced.

Next, an IC socket in accordance with a second embodiment of the present invention will be described with reference to FIGS. 3 to 14. For this IC socket, an IC package ($\mu$BGA) with a pitch between electrodes of 0.5 mm, having 16×16, a total of 256 electrodes is mounted, and this pitch is enlarged and changed to 1.27 mm of a pitch between connection terminals of an external connection body, the number of terminals thereof being 16×16, a total of 256.

Figure 3:
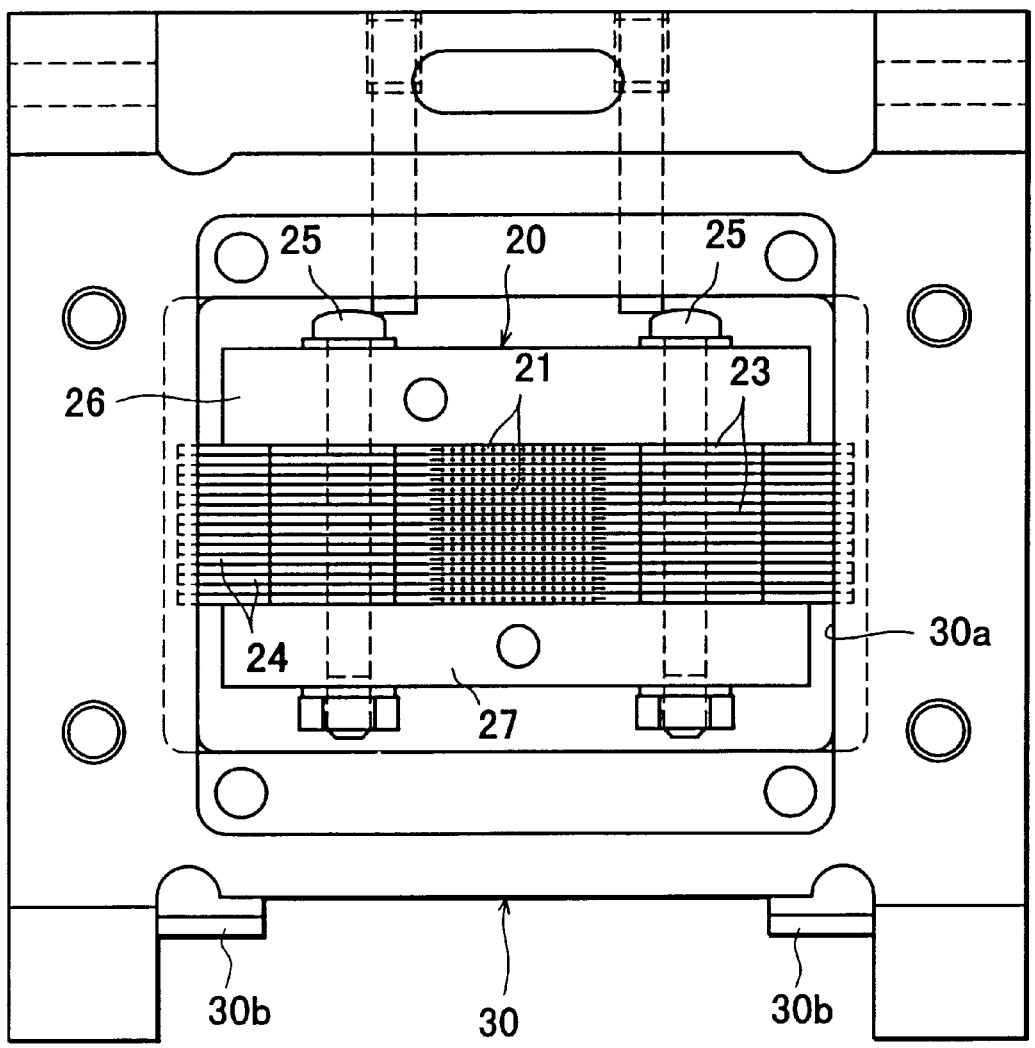
FIG. 3 is a plan view showing a state in which the IC socket in accordance with the present invention is inserted in the case, for explaining a second embodiment of an IC socket in accordance with the present invention.
Figure 4:
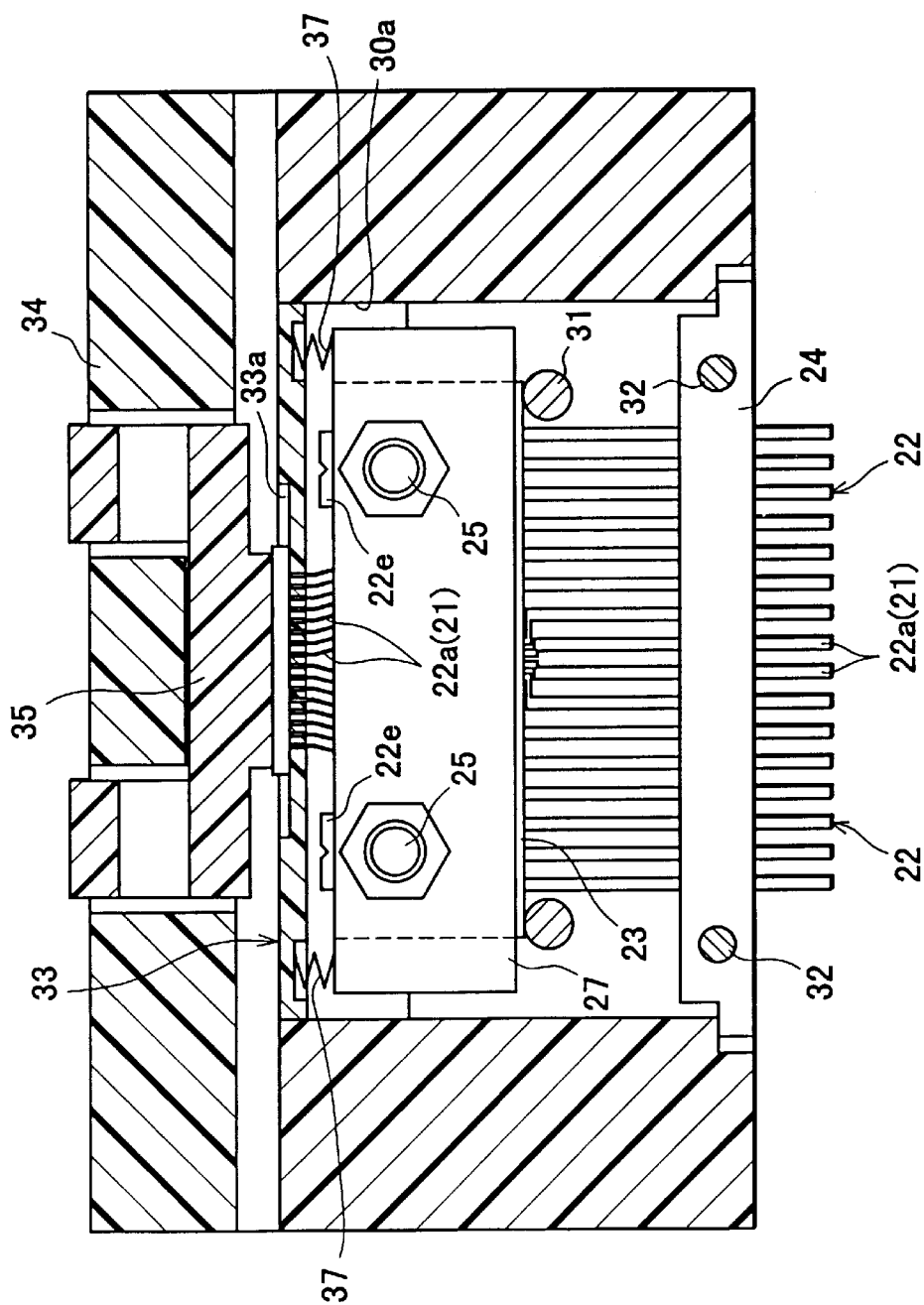
FIG. 4 is a sectional front view of the IC socket shown in FIG. 3.
Figure 5:
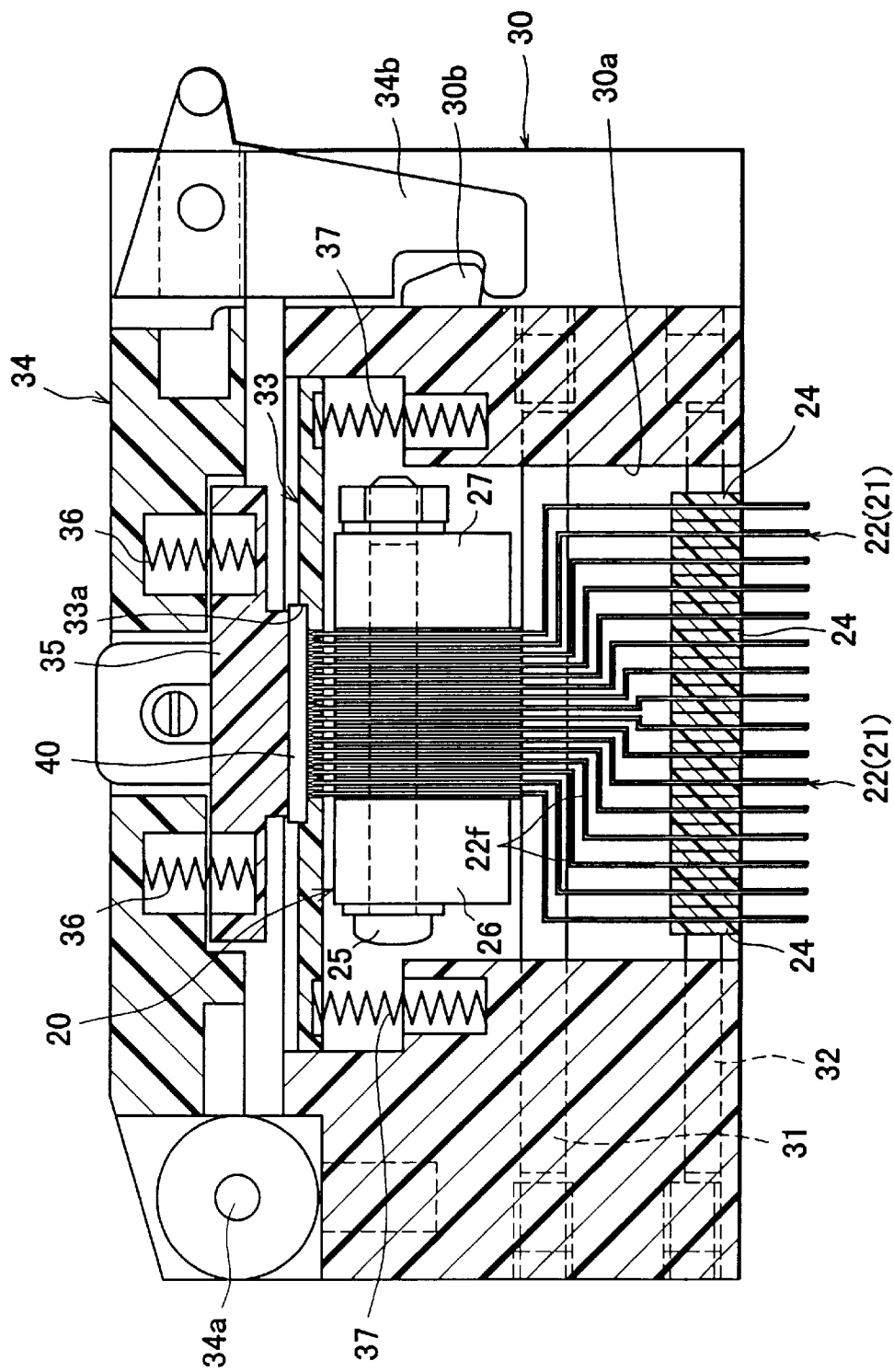
FIG. 5 is a sectional side view of the IC socket shown in FIG. 3.

As shown in FIGS. 3 to 5, an IC socket 20, having a plurality of contact pins 21 arranged in a matrix form, is used by being fixed in a case 30.

Figure 6:
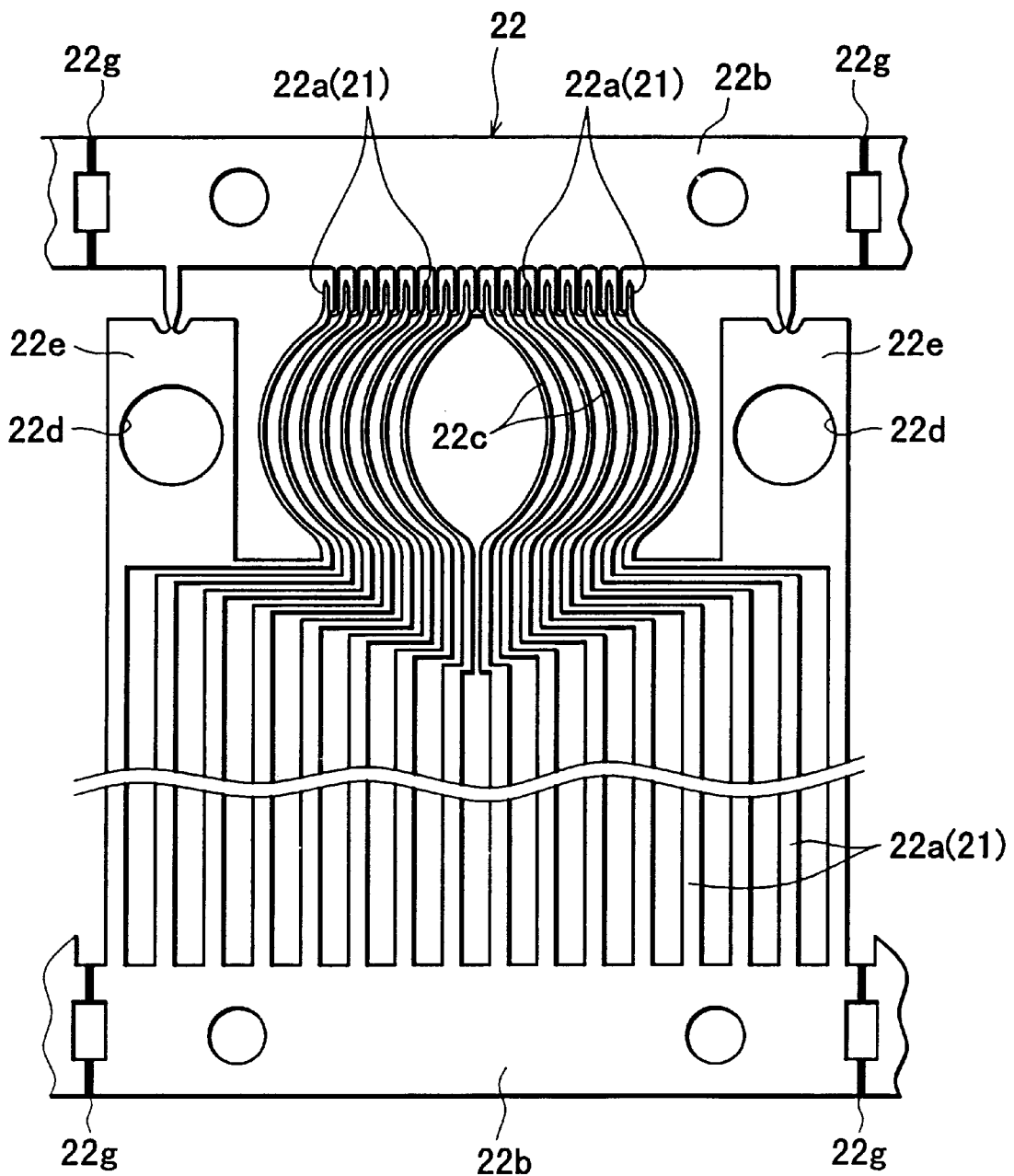
FIG. 6 is a front view showing a configuration of a lead frame used in the IC socket shown in FIG. 3.
Figure 7:
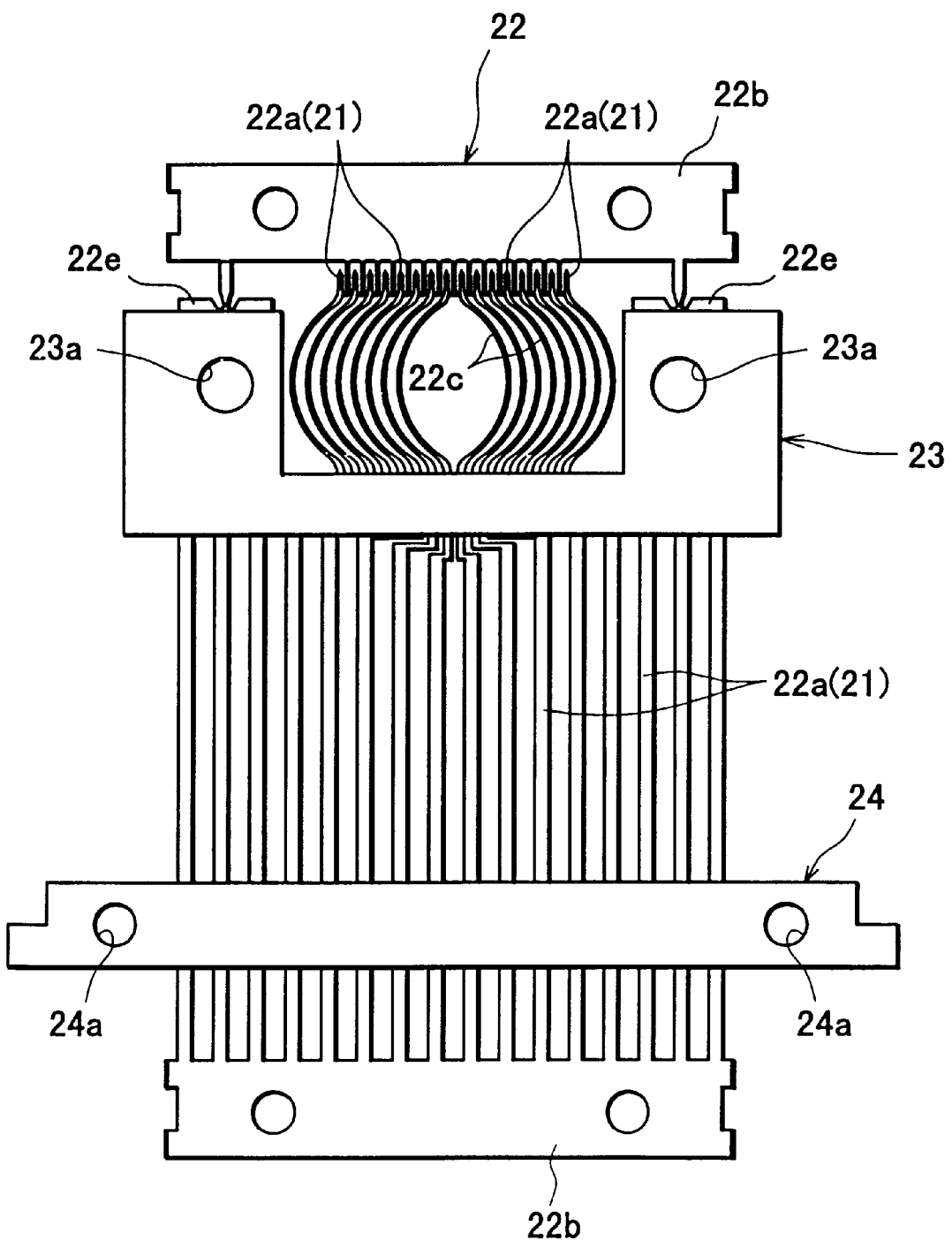
FIG. 7 is front view showing a state in which first and second fixing portions are provided on the lead frame shown in FIG. 6.

The contact pins 21 are formed by a plurality of lead frames 22 having 16 leads 22a arranged in parallel in a single plane as shown in FIG. 6. For each lead frame 22, both ends of 16 leads 22a are connected by a frame 22b, and on one end side of the leads 22a are formed spring portions 22c formed in an arcuate shape and two stoppers 22e having an insertion hole 22d. One end side of 16 leads 22a is formed so as to agree with the electrode pitch (=0.5 mm) of an IC package to be mounted, and the other end side with the connection terminal pitch (=1.27 mm) of an external tester to be connected. As shown in FIG. 7, the lead frame 22 is provided with a first fixing portion 23 and a second fixing portion 24. The first fixing portion 23, which is made of an electrical insulating and heat resistant synthetic resin such as liquid crystal polymer (LCP), polyphenylene sulfide (PPS), polyether ketone (PEEK), polybutylene terephthalate (PBT), or polyamide imide (PAI), fixes the leads 22a in the arrangement direction thereof in the vicinity of the spring portion 22c, and the second fixing portion 24 made of the above-mentioned resin fixes the leads 22a in the arrangement direction thereof on the other end side.

The first fixing portion 23 is provided on the lead frame 22 in a concave shape such that the portion of the spring portion 22c is open, and formed with bolt holes 23a on both sides as shown in FIG. 7. The first fixing portion 23 is used for stacking a plurality of lead frames 22 and fixing the plural lead frames 22 by means of bolts 25 inserted in the bolt holes 23a, by which the IC socket 20 is formed.

The second fixing portion 24 is provided on the other end side of the leads 22a, and formed with pin holes 24a on both sides.

For the lead frame 22, like the first embodiment, one end side and the other end side of 16 leads 22a are bent substantially in parallel with respect to the aforesaid single plane via a step portion 22f. Then, 16 lead frames are stacked, by which 16×16, that is, a total of 256 contact pins 21 arranged in a matrix form are formed.

The lead frame 22 was manufactured as described below.

First, the lead frame 22 shown in FIG. 6 was manufactured by etching using a beryllium copper alloy sheet with a thickness of 0.1 mm. As an etchant, for example, ferric chloride solution or the like was used. For the lead frame 22, Ni plating with a thickness of about 3 $\mu$m was given to the substrate, and Pd-25Ni plating with a thickness of about 0.3 $\mu$m was given to the part on the substrate. In place of Pd-25Ni plating, the lead frame 22 may be plated with Au or Pd. Also, an electrical insulating paint may be applied to the lead frame 22 except both ends of the leads 22a, or an insulating tape may be applied to prevent the conduction between the leads 22a.

Here, as shown in FIG. 6, a plurality of lead frames 22 are connected in the arrangement direction of the leads 22a by the frames 22b, and as shown in FIG. 7, the lead frames 22 are cut off at a half-etched portion 22g formed thin.

Next, as shown in FIG. 7, the first fixing portion 23 and the second fixing portion 24 were installed on the leads 22a of the cut-off lead frame 22 in the vicinity of the spring portion 22c and on the other end side, respectively, and the two frames 22b were wrenched off.

Then, as with the case of the above-described first embodiment, the lead frame 22 was bent at right angles with respect to the aforesaid single plane on the first fixing portion 23 side on one end side and further bent back at right angles on the second fixing portion 24 side to form the step portion 22f (see FIG. 5). Thereby, the lead frame 22 was bent so that both end sides of the leads 22a are substantially in parallel to each other via the step portion 22f. At this time, because plural lead frames 22 were stacked, for the second lead frame 22, the bending position on the first fixing portion 23 side was set to be a position distant from the spring portion 22c, and the bending position on the second fixing portion 24 side was set to be a position further at the distance of the pitch (=1.27 mm) of connection terminal on the external tester.

By changing the bending position of the lead 22a in this manner, for the first and second lead frames 22, the contact pin 21 can be formed so that, while the pitch on one end is kept equal to the electrode pitch of 0.5 mm of the IC package, the pitch on the other end can be made equal to the pitch (=1.27 mm) of connection terminal on the external tester.

Such a change of the bending position of the lead 22a was repeated successively on and after the third lead frame 22, whereby a total of 16 lead frames 22 were manufactured.

These 16 lead frames 22 were stacked by lapping the first fixing portions 23, tightening plates 26 and 27 were disposed on both sides of the first fixing portions 23, and the lead frames 22 were fixed by the bolts 25 inserted in the bolt holes 23a, by which the IC socket 20 was obtained.

The IC socket 20 thus assembled is inserted in an opening 30a formed in the center of the case 30 and fixed to the case 30 with pins 31 and 32 as shown in FIGS. 3 to 5. At this time, the pins 31 penetrate the case 30 and abut on the lower end of the first fixing portion 23, while the pins 32 penetrate the case 30 and are inserted in the pin holes 24a of the second fixing portion 24.

The IC socket 20 is provided with a perforated plate 33 on the spring portion 22c side of the lead frame 22, that is, on one side of the contact pin 21 as shown in FIG. 4, which perforated plate 33 is formed with 16×16, a total of 256 insertion holes with an inside diameter of 0.3 mm with a pitch (=0.5 mm) equal to the electrode pitch of an IC package 40. Thereby, the pitch on one side of the plural contact pins 21 is held at the pitch equal to the electrode pitch of the IC package 40. The perforated plate 33 is formed with a positioning groove 33a in the center thereof for positioning the IC package 40 (see FIG. 5).

In FIG. 3, a cover 34 shown in FIGS. 4 and 5 is omitted for showing the IC socket 20 inserted in the case 30. Also, in FIG. 5, the cover 34 is opened and closed around a hinge pin 34a, and locked by a protrusion 30b provided on the wall surface of the case 30 by means of a hook 34b.

When the IC package 40 is inspected by using the IC socket 20, as shown in FIG. 5, the IC package 40 is disposed in the positioning groove 33a in the perforated plate 33, and the cover 34 is closed. Along with this, the case 30 is placed on an external tester (not shown), and the other end of the contact pin 21 is brought into direct contact with the connection terminal of the tester.

Then, as shown in FIG. 5, a pressure plate 35 incorporated in the cover 34 pushes down the IC package 40 together with the perforated plate 33 by a spring force from first springs 36 disposed between the pressure plate 35 and the cover 34. At this time, the perforated plate 33 is urged toward the pressure plate 35 by second springs 37 disposed between the perforated plate 33 and the case 30.

Therefore, for the IC socket 20, one end of each contact pin 21 protrudes from the hole in the perforated plate 33, and comes into contact with the corresponding electrode (not shown) of the IC package 40. Thereupon, each electrode of the IC package 40 is connected to the connection terminal on the outside, so that the IC socket 20 allows the inspection of electrical properties of the IC package 40, for example, the burn-in test to be made at a low cost without using an expensive multilayer printed board.

At this time, the IC socket 20 has the spring portion 22c formed in an arcuate shape on the lead 22a of each lead frame 22 consisting of the contact pin 21. For this reason, the contact pin 21 of the IC socket 20 comes into contact with the electrode of the IC package 40 always with a fixed contact pressure, and the lowering position of the perforated plate 33 is regulated by the stoppers 22e of the lead frame 22, so that the maximum contact pressure is also fixed at a fixed value.

Needless to say, the lead frame 22 made up of the plural contact pins 21 is not limited to the above embodiments.

Figure 8A:
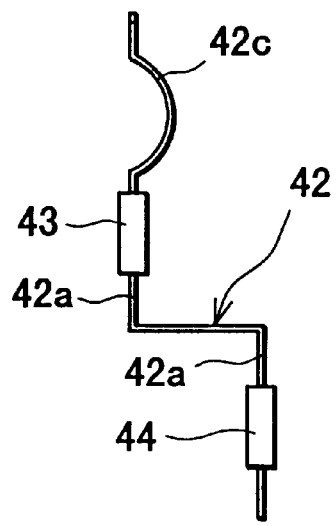
FIG. 8A is a side view showing a modification of a lead frame used in the IC socket in accordance with the second embodiment.
Figure 8B:
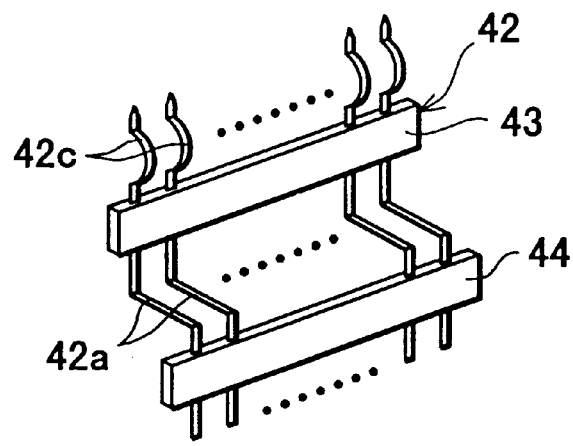
FIG. 8B is a perspective view showing the modification of the lead frame shown in FIG. 8A.
Figure 9:
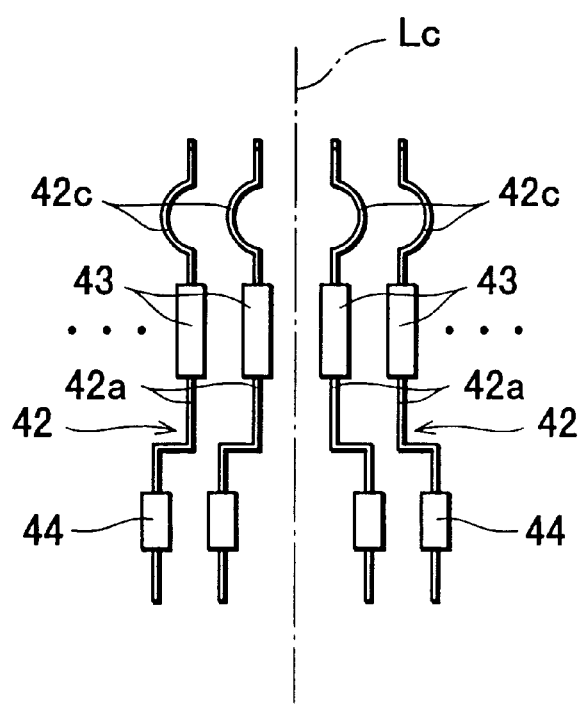
FIG. 9 is a side view showing a state in which the lead frames shown in FIG. 8A are stacked.

For example, like a lead frame 42 shown in FIGS. 8A and 8B, a spring portion 42c formed in an arcuate shape may be formed to as to protrude in the direction perpendicular to the arrangement plane of leads 42a. At this time, the lead frame 42 is provided with first and second fixing portions 43 and 44, and when a plurality of lead frames 42 are stacked, they are stacked so that the orientations of the spring portions 42c differ with the centerline Lc being a boundary. Thus, the right and left spring portions 42c of the stacked lead frames 42 do not interfere with each other. Also, because of the symmetry with respect to the centerline Lc, the number of lead frames 42 to be bent is only a half (eight) of the necessary number (sixteen).

In the following description, for the first and second fixing portions 43 and 44, only the reference numeral thereof is applied in the figures, and the explanation thereof is omitted.

Figure 10:
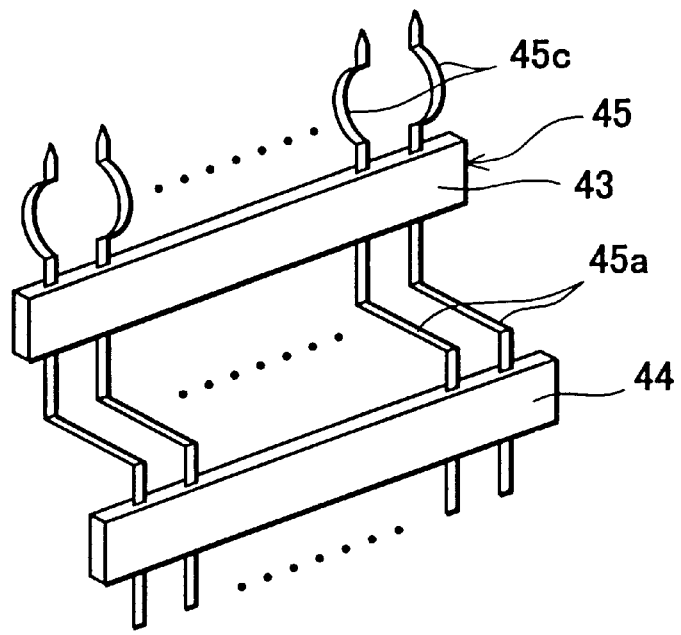
FIG. 10 is a perspective view showing another modification of the aforesaid lead frame.

Whereas, like a lead frame 45 shown in FIG. 10, a spring portion 45c formed in an arcuate shape may be formed so as to protrude alternately in the direction perpendicular to the arrangement plane of leads 45a. By this configuration, the lead frame 45 can have an increased arc of the spring portion 45c, so that the spring constant can be decreased.

Figure 11:
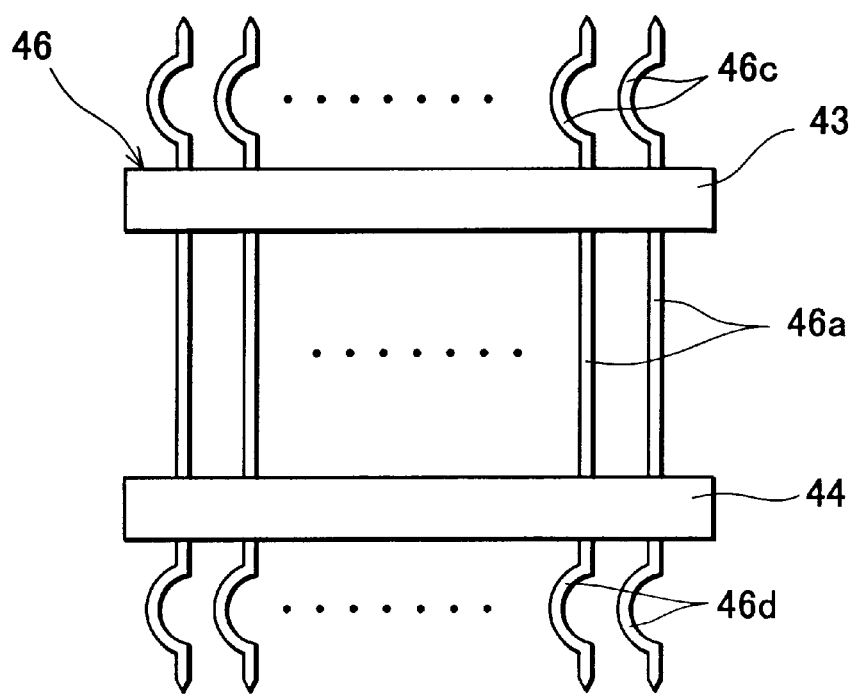
FIG. 11 is a front view showing still another modification of the aforesaid lead frame.

Also, like a lead frame 46 shown in FIG. 11, a spring portion 46c formed in an arcuate shape is formed in the arrangement plane on one end side of the lead 46a, and an arcuate spring portion 46d is formed in the same way on the external tester side on the other end side of the lead 46a. By this configuration, the lead 46a of the lead frame 46 can be brought into contact with the connection terminal on the outside with a proper contact pressure.

Figure 12A:
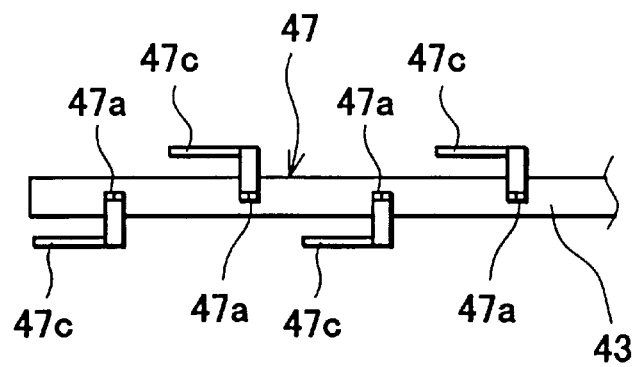
FIGS. 12A, 12B and 12C are a plan view, side view, and front view, respectively, showing still another modification of the aforesaid lead frame.
Figure 12B:
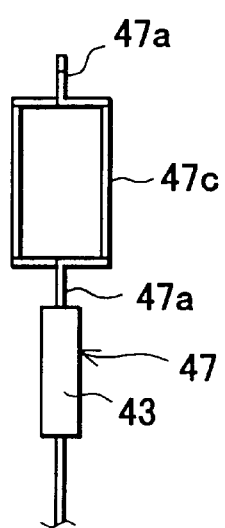
Figure 12C:
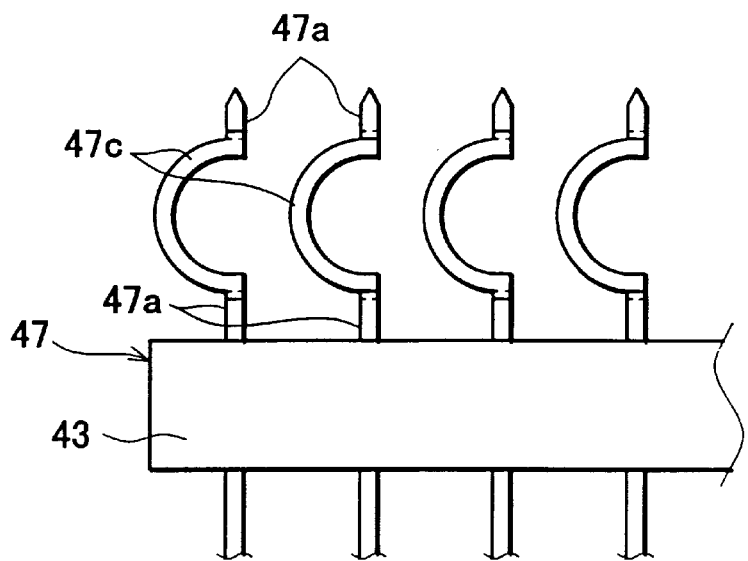

Further, like a lead frame 47 shown in FIGS. 12A to 12C, a spring portion 47c formed in an arcuate shape is formed so as to protrude alternately in the direction perpendicular to the arrangement plane of leads 47a, the tip end side of the lead 47a and the first fixing portion 43 side are arranged in the arrangement plane of the leads 47a, and the spring portion 47c is formed in parallel to the arrangement plane of the leads 47a at a position where the lead 47a is protruded from the arrangement plane in the direction perpendicular thereto. By this configuration, the spring portion 47c of the lead frame 47 can be formed into a greater arc even if the deflection is considered.

Figure 13:
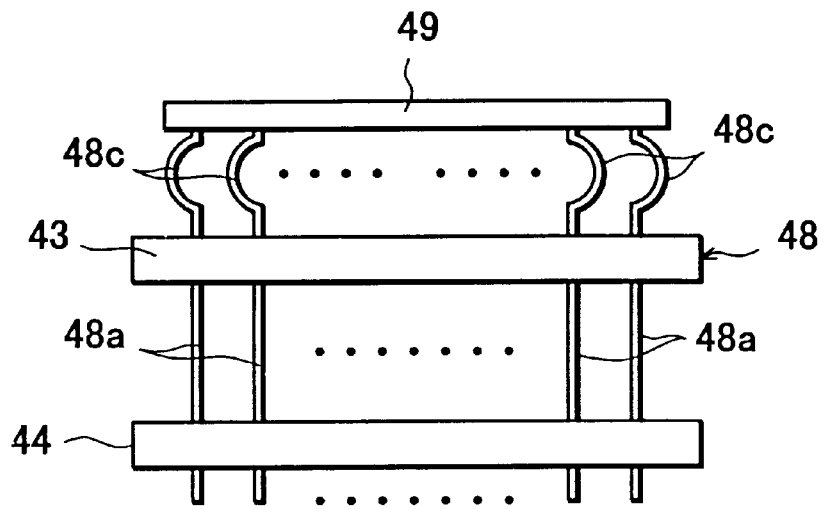
FIG. 13 is a front view showing still another modification of the aforesaid lead frame.

Whereas, like a lead frame 48 shown in FIG. 13, the continuity between a lead 48a provided with an arcuate spring portion 48c and the electrode of a semiconductor device (not shown) such as an IC package may be provided via an anisotropic conductive film 49 which has electric conductivity in the thickness direction only but does not have electric conductivity in the lengthwise direction (transverse direction in the figure). By this configuration, the lead 48a of the lead frame 48 need not be connected individually to the electrode of the semiconductor device (not shown), so that the ease with which the IC socket is used is increased.

As such an anisotropic conductive film 49, for example, a substance in which a conductive metal, fine particles such as graphite, or a wire-form conductor is embedded in an elastic synthetic resin such as silicone rubber and thermoplastic elastomer, a substance in which a conductive rubber sheet and an electrical insulating rubber sheet are laminated alternately, or the like can be used.

Figure 14:
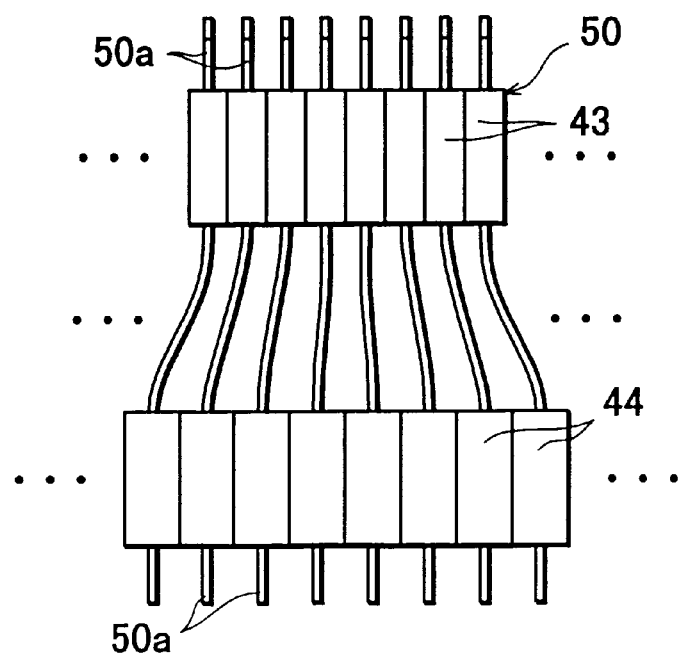
FIG. 14 is a side view showing still another modification of the aforesaid lead frame.

Also, like a lead frame 50 shown in FIG. 14, the pitches at both ends of leads 50a when the plural lead frames 50 are stacked may be made to agree with the electrode pitch of semiconductor device or the pitch of the electrical connection terminal of external connection body by the first fixing portion 43 or the second fixing portion 44. If such a lead frame 50 is used, the electrode pitch of semiconductor device or the pitch of the electrical connection terminal of external connection body can be determined when the lead frame 50 is manufactured, so that the assembly of the IC socket is made easy.

For this lead frame 50, natural bend of the leads 50a may be allowed as shown in FIG. 14 by giving a predetermined margin to the length of the lead 50a between the first and second fixing portions 43 and 44, or the leads 50a between the first and second fixing portions 43 and 44 may be bent slantwise beforehand.

The lead frame 22 in accordance with the second embodiment is configured so that the pitch of 16 leads 22a agrees with the electrode pitch (=0.5 mm) of the IC package to be mounted on one end side and agrees with the pitch (=1.27 mm) of the connection terminal of the external tester to be connected on the other end side. However, in the lead frame 22, the pitch of the leads 22a is not limited to this. Needless to say, the leads 22a may be formed with an arbitrary pitch such as to agree with the electrode pitch of the semiconductor device to be inspected.

INDUSTRIAL APPLICABILITY

According to the first invention, the IC socket is connected directly to the terminal of external connection body such as an external tester for performing burn-in test. Therefore, there can be provided an IC socket capable of performing an inspection of electrical properties of a semiconductor device at a low cost without using an expensive multilayer printed board for changing the pitch.

According to the second invention, when the lead frame is bent, the pitch in the direction perpendicular to the lead arrangement direction can be set at the lead frame stacking intervals at the other end, that is, on the external connection body side of the lead by appropriately changing the height of a step portion. Therefore, for the IC socket of the second invention, the pitch of the plural contact pins is enlarged and changed from the electrode pitch of the semiconductor device to the pitch of the electrical connection terminal of the external connection body, so that an inexpensive printed board such as a double side laminated plate and four layer laminated plate can be used.

According to the third invention, the plural contact pins in each lead frame are fixed in the vicinity of the spring portion with a synthetic resin, so that each contact pin can apply a fixed spring pressure to the electrode of semiconductor device independently of the arrangement position.

According to the fourth invention, the plural contact pins in each lead frame are fixed on the other end side, that is, on the external connection body side with a synthetic resin, so that the pitch of the plural contact pins can be kept constant on the external connection body side.

According to the fifth invention, the pitch of the plural contact pins can be kept constant on the semiconductor device side by the perforated plate.

According to the sixth invention, the electrode pitch of the semiconductor device and the pitch of the electrical connection terminal of the external connection body are determined when the lead frame is prepared, so that the IC socket can be assembled easily.

What is claimed is:

1. An IC socket comprising a plurality of contact pins, wherein:
    said contact pins comprise a plurality of lead frames each having a plurality of leads at opposite sides thereof arranged parallel to one another in a single plane; and
    said contact pins are formed by: (i) arranging ends of the leads of each of the lead frames such that the ends of the leads at the opposite sides respectively have a pitch identical to an electrode pitch of a semiconductor device to be mounted to the IC socket and a pitch identical to a pitch of electrical connection terminals of an external connection body to be connected to the IC socket, (ii) bending each of the lead frames to form a step portion therein such that the ends of the leads at the opposite sides extend substantially in parallel with the single plane, and (iii) stacking the bent lead frames such that the ends of the leads on one side of the stacked lead frames are arrayed in matrix form and have pitches identical to the electrode pitch of the semiconductor device, and such that the ends of the leads on the other side of the stacked lead frames are arrayed in matrix form and have two-dimensionally enlarged pitches identical to the pitch of the electrical connection terminals of the external connection body.

2. The IC socket according to claim 1, wherein each of said lead frames is formed with a spring portion formed in an arcuate shape on one end side of said plurality of leads, and wherein each of said lead frames includes a first fixing portion, made of an electrical insulating resin, for fixing said plurality of leads in a vicinity of said spring portion in an arrangement direction of the leads.

3. The IC socket according to claim 2, wherein each of said lead frames includes a second fixing portion, also made of the electrical insulating resin, for fixing the other end side of said plurality of leads in the arrangement direction of the leads.

4. The IC socket according to claim 1, wherein a perforated plate for positioning each contact pin is provided on an end side of said plurality of contact pins on which the semiconductor device is to be mounted.

5. The IC socket according to claim 3, wherein when said plurality of lead frames are stacked by one of said first fixing portion and said second fixing portion, the pitches at the ends of the leads agree with the electrode pitch of the semiconductor device and the pitch of the electrical connection terminals of the external connection body, respectively.

6. The IC socket according to claim 2, wherein a perforated plate for positioning each contact pin is provided on an end side of said plurality of contact pins on which the semiconductor device is to be mounted.

7. The IC socket according to claim 3, wherein a perforated plate for positioning each contact pin is provided on an end side of said plurality of contact pins on which the semiconductor device is to be mounted.

8. The IC socket according to claim 7, wherein when said plurality of lead frames are stacked by one of said first fixing portion and said second fixing portion, the pitches at the ends of the leads agree with the electrode pitch of the semiconductor device and the pitch of the electrical connection terminals of the external connection body, respectively.

* * * * *